US012765193B2

(12) United States Patent
Ye et al.

(10) Patent No.: US 12,765,193 B2
(45) Date of Patent: Oct. 13, 2026

(54) DISPLAY PANEL AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Chao Ye, Beijing (CN); Xiaodan Wei, Beijing (CN); Baosheng He, Beijing (CN); Tang Yang, Beijing (CN); Xiaoyi Wang, Beijing (CN); Pei Liu, Beijing (CN)

(73) Assignees: Chengdu BOE Optoelectronics Technology Co., Ltd., Chengdu (CN); Beijing BOE Technology Development Co., Ltd., Beijing (CN)

( * ) Notice: Subject to any disclaimer, the term of this patent is extended or adjusted under 35 U.S.C. 154(b) by 383 days.

(21) Appl. No.: 18/690,270

(22) PCT Filed: Jul. 5, 2023

(86) PCT No.: PCT/CN2023/105837
§ 371 (c)(1),
(2) Date: Mar. 8, 2024

(87) PCT Pub. No.: WO2024/022058
PCT Pub. Date: Feb. 1, 2024

(65) Prior Publication Data

US 2024/0407206 A1 Dec. 5, 2024

(30) Foreign Application Priority Data

Jul. 25, 2022 (CN) ........................ 202210875218.6

(51) Int. Cl.
*H10K 59/128* (2023.01)
*G09G 3/3225* (2016.01)
*H10K 59/131* (2023.01)

(52) U.S. Cl.
CPC ......... *H10K 59/128* (2023.02); *G09G 3/3225* (2013.01); *H10K 59/131* (2023.02);
(Continued)

(58) Field of Classification Search
CPC .. H10K 59/128; H10K 59/131; G09G 3/3225; G09G 2300/0426;
(Continued)

(56) References Cited

U.S. PATENT DOCUMENTS

| | | | | |
|---|---|---|---|---|
| 7,622,863 | B2 * | 11/2009 | Seo | G09G 3/3225 313/506 |
| 10,923,031 | B2 * | 2/2021 | Yang | G09G 3/3233 |
| 11,127,933 | B2 * | 9/2021 | Cheng | H10K 50/115 |

FOREIGN PATENT DOCUMENTS

| | | |
|---|---|---|
| CN | 103794179 A | 5/2014 |
| CN | 105140260 A | 12/2015 |

(Continued)

OTHER PUBLICATIONS

International Search Report for PCT/2023/105837 Mailed Sep. 19, 2023.

*Primary Examiner* — Tu-Tu V Ho

(57) ABSTRACT

The present disclosure provides a display panel and a display apparatus, the display panel includes an base substrate and multiple pixel unit groups disposed on the base substrate and arranged in an array, each pixel unit group including a first pixel unit and a second pixel unit disposed on the base substrate; the first pixel unit includes a pixel driving circuit and a first light-emitting device electrically connected with the pixel driving circuit, and the second pixel unit includes a second light-emitting device; for the pixel unit groups located in a same row, each pixel driving circuit and a second electrode of each second light-emitting device are connected to a same gate line; for the pixel unit groups located in a same column, each pixel driving circuit is
(Continued)

connected to a same data line, and a first electrode of each second light-emitting device is connected to a same data line.

18 Claims, 5 Drawing Sheets

(52) U.S. Cl.
CPC ............... *G09G 2300/0426* (2013.01); *G09G 2300/0465* (2013.01); *G09G 2300/0804* (2013.01); *G09G 2300/0842* (2013.01); *G09G 2320/02* (2013.01); *G09G 2370/00* (2013.01)

(58) Field of Classification Search
CPC ... G09G 2300/0465; G09G 2300/0804; G09G 2300/0842; G09G 2320/02; G09G 2370/00
USPC .......................................................... 257/72
See application file for complete search history.

(56) References Cited

FOREIGN PATENT DOCUMENTS

| | | | |
|---|---|---|---|
| CN | 106252383 | A | 12/2016 |
| CN | 109599057 | A | 4/2019 |
| CN | 110197839 | A | 9/2019 |
| CN | 111403454 | A | 7/2020 |
| CN | 111489658 | A | 8/2020 |
| CN | 112150970 | A | 12/2020 |
| CN | 113571560 | A | 10/2021 |
| CN | 115207071 | A | 10/2022 |
| KR | 20060081508 | A | 7/2006 |
| KR | 20180078793 | A | 7/2018 |

* cited by examiner

DISPLAY PANEL AND DISPLAY APPARATUS

CROSS-REFERENCE TO RELATED APPLICATION

The present application is a U.S. National Phase Entry of International Application No. PCT/CN2023/105837 having an international filing date of Jul. 5, 2023, which claims the priority to the Chinese Patent Application No. 202210875218.6, filed on Jul. 25, 2022, to the CNIPA. The above-identified applications are incorporated herein by reference in their entireties.

TECHNICAL FIELD

The present disclosure pertains to the field of display technologies, and specifically to a display panel and a display apparatus.

BACKGROUND

At present, display panels are mainly single panels, but in many scenarios, for example, in digital signs, window inquiry equipment, exhibition halls, and other advertising playing equipment in public places, it is often necessary to display a same picture on both front and back sides, so as to facilitate people in opposite positions to all be capable of watching the picture of the display panel.

In order to achieve double-sided display of a display panel, in one case, a Liquid Crystal Display (LCD) panel is used in traditional technical solutions. Because no light source can be placed on both sides of the panel, only ambient light can be used as a light source, which leads to a limited luminous brightness of the display panel. Therefore, two independent LCD panels are usually used to achieve double-sided display. However, in this case, to ensure that two LCD panels display a same picture, relatively complex connection and driving relationships are needed, which leads to a great increase in a manufacturing cost of the display panel and an increase in a thickness of the display panel, which does not conform to a thin and light design of the display panel.

In another case, using Organic Electroluminescence Display (OLED) may solve a problem of a limited luminescence brightness of an LCD panel because of its self-luminescence characteristics. However, when using the OLED to achieve double-sided display, it is still necessary to prepare two OLED panels separately, and then make them fit each other, which is not conducive to achieving lightness and thinness and has a relatively high preparation cost of products.

SUMMARY

The present disclosure aims at solving at least one of technical problems existing in the prior art, and provides a display panel and a display apparatus.

In a first aspect, an embodiment of the present disclosure provides a display panel, including a base substrate and multiple pixel unit groups disposed on the base substrate and arranged in an array, each of the pixel unit groups including a first pixel unit and a second pixel unit disposed on the base substrate; the first pixel unit includes a pixel driving circuit and a first light-emitting device electrically connected with the pixel driving circuit, and the second pixel unit includes a second light-emitting device; among them, for the pixel unit groups located in a same row, each of pixel driving circuits and a second electrode of each of second light-emitting devices are connected to a same gate line; for the pixel unit groups located in a same column, each of the pixel driving circuits is connected to a same data line, and a first electrode of each of the second light-emitting devices is connected to the same data line.

In some embodiments, the multiple pixel unit groups arranged in an array include the pixel unit groups of M rows by N columns; where M is a positive integer greater than or equal to 1, and N is a positive integer greater than or equal to 2; the pixel unit groups of N columns are arranged along a first direction in sequence, the N data lines are arranged along the first direction in sequence, and an i-th column of the pixel driving circuits and an i-th data line are connected; $0<i\leq N$, and i is a positive integer; first electrodes of a j-th column of the second light-emitting devices are connected to an $(N-j+1)$-th data line; $1\leq j\leq N$, where j is a positive integer.

In some embodiments, the display panel further includes a connecting signal line; one data line connected with the pixel driving circuits is connected with one connecting signal line, and the connecting signal line is connected with the first electrode of the second light-emitting device through a trace region; and orthographic projections of all of the connecting signal lines on the base substrate are not overlapped.

In some embodiments, the display panel includes a driving circuit layer disposed on the base substrate; the pixel driving circuit is located in the driving circuit layer; the first light-emitting device is located at a side of the driving circuit layer away from the base substrate; the second light-emitting device is located at a side of the driving circuit layer close to the base substrate; for one of the pixel unit groups, an orthographic projection of the first light-emitting device on the base substrate and/or an orthographic projection of the second light-emitting device on the base substrate are both at least partially overlapped with an orthographic projection of the pixel driving circuit on the base substrate.

In some embodiments, orthographic projections of any two of the first light-emitting device, the second light-emitting device, and the pixel driving circuit on the base substrate are overlapped.

In some embodiments, the pixel driving circuit includes a thin film transistor and a storage capacitor; the driving circuit layer includes a first semiconductor layer, a first conductive layer, and a second conductive layer disposed at a side of the second light-emitting device away from the base substrate in sequence; an active layer of the thin film transistor is located in the first semiconductor layer; a gate of the thin film transistor, a first electrode plate of the storage capacitor, and the gate line are all located in the first conductive layer; and a source and a drain of the thin film transistor are both located in the second conductive layer.

In some embodiments, the display panel further includes a buffer layer disposed at a side of the first semiconductor layer close to the base substrate, and a first insulating layer disposed between the first semiconductor layer and the first conductive layer; second electrodes of the second light-emitting devices in a same pixel unit group are electrically connected with the gate line through a connecting via hole; and the connecting via hole penetrates a second pixel defining layer, the buffer layer, and the first insulating layer in sequence.

In some embodiments, the display panel further includes a third conductive layer, a first pixel defining layer, and a fourth conductive layer that are disposed at a side of the driving circuit layer away from the base substrate in sequence; a first electrode of the first light-emitting device is located in the third conductive layer; a second electrode of the first light-emitting device is located in the fourth conductive layer; the first electrode of the first light-emitting device is a reflecting electrode, and the second electrode of the first light-emitting device is a transmitting electrode; a first evaporated layer of the first light-emitting device is located in the first pixel defining layer, and an orthographic projection of the second electrode of the first light-emitting device on the base substrate covers an orthographic projection of the first evaporated layer on the base substrate.

In some embodiments, the display panel further includes a fifth conductive layer, a second pixel defining layer, and a sixth conductive layer that are disposed at a side of the driving circuit layer close to the base substrate in sequence; a first electrode of the second light-emitting device is located in the fifth conductive layer; a second electrode of the second light-emitting device is located in the sixth conductive layer; the first electrode of the second light-emitting device is a reflecting electrode, and the second electrode of the second light-emitting device is a transmitting electrode; a second evaporated layer of the second light-emitting device is located in the second pixel defining layer, and an orthographic projection of the second electrode of the second light-emitting device on the base substrate covers an orthographic projection of the second evaporated layer on the base substrate.

In a second aspect, an embodiment of the present disclosure also provides a display apparatus, including the display panel according to any one of the above.

Figure 1:
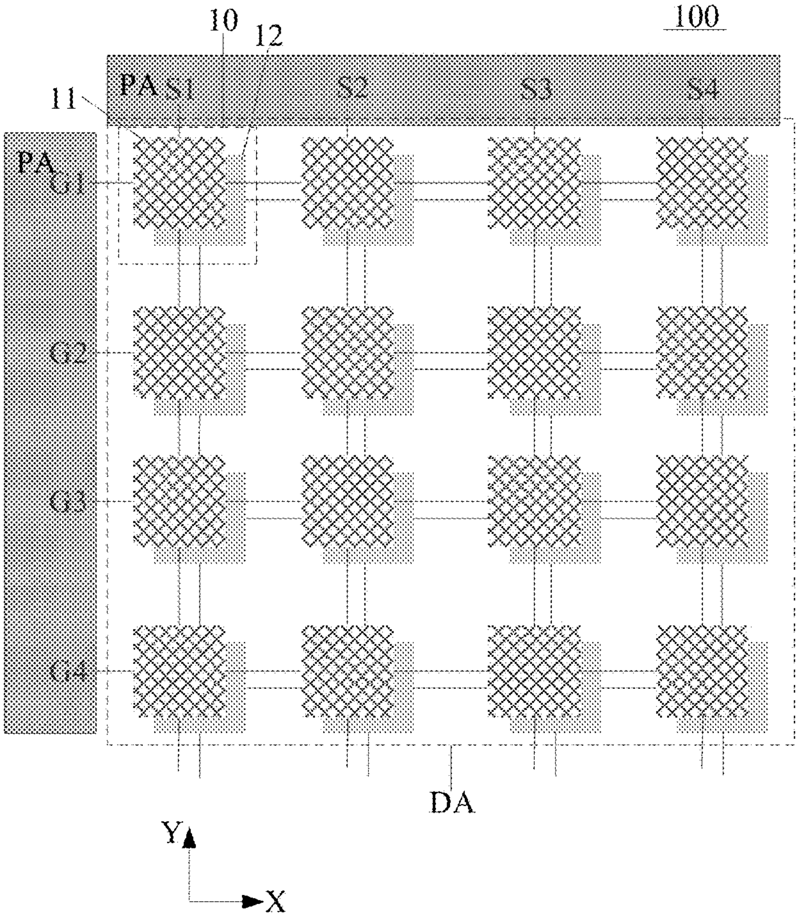
FIG. 1 is a schematic diagram of a connection structure between pixel units according to an embodiment of the present disclosure.

Among them, reference signs are: a display panel 100; a base substrate 01; a pixel unit group 10; a first pixel unit 11; a second pixel unit 12; a pixel driving circuit 111; a first light-emitting device OLED1; a second light-emitting device OLED2; a first electrode 21 of the second light-emitting device; a second electrode 22 of the second light-emitting device; a second evaporated layer 23; a first electrode 31 of the first light-emitting device; a second electrode 32 of the first light-emitting device; a first evaporated layer 33; a switching thin film transistor T1; a driving thin film transistor T2; a gate 41 of the switching thin film transistor; a storage capacitor Cst; a first electrode plate Cst1 of the storage capacitor; a second electrode plate Cst2 of the storage capacitor; a source 42 of the switching thin film transistor; a drain 43 of the switching thin film transistor; an active layer 44 of the switching thin film transistor; a gate 51 of a driving thin film transistor; a source 52 of the driving thin film transistor; a drain 53 of the driving thin film transistor; an active layer 54 of the driving thin film transistor; a driving circuit layer 02; a first insulating layer 71; a second insulating layer 72; an opening layer 73; a flat layer 74; a buffer layer 75; a second pixel defining layer 76; a first pixel defining layer 77; a spacer layer 78; an encapsulation layer 79.

DETAILED DESCRIPTION

In order to make purposes, technical solutions, and advantages of embodiments of the present disclosure be clearer, the technical solutions of the embodiments of the present disclosure will be clearly and completely described below in conjunction with accompanying drawings of the embodiments of the present disclosure, and it will be apparent that the described embodiments are only a part of the embodiments of the present disclosure, not all of them. Components of the embodiments of the present disclosure generally described and illustrated in the accompanying drawings herein may be arranged and designed in a variety of different configurations. Accordingly the following detailed description of the embodiments of the present disclosure provided in the accompanying drawings is not intended to limit the scope of the present disclosure claimed but is merely representative of selected embodiments of the present disclosure. Based on the embodiments of the present disclosure, all other embodiments obtained by a person of ordinary skill in the art without paying any inventive effort are within the scope of protection of the present disclosure.

Unless otherwise defined, technical terms or scientific terms used in the present disclosure should have meanings as commonly understood by those of ordinary skills in the art that the present disclosure belongs to. The "first", "second", and similar terms used in the present disclosure do not indicate any order, quantity, or importance, but are used only for distinguishing different components. Similarly, "one", "a", "this", or a similar word does not indicate a limitation on quantity, but rather indicates a presence of at least one. "Include", "contain", or a similar word means that elements or objects appearing before the word cover elements or objects listed after the word and their equivalents, but does not exclude other elements or objects. "Connect", "Connected", or a similar word is not limited to a physical or mechanical connection, but may include an electrical connection, whether direct or indirect. "Upper", "lower", "left", "right", etc., is only used for indicating a relative positional relationship, and when an absolute position of a described object is changed, the relative positional relationship may also be correspondingly changed.

The reference to "multiple or several" in the present disclosure refers to two or more than two. "And/or", which describes an association relationship between associated objects, indicates that there may be three relationships, for example, A and/or B, which may indicate that there are three cases: A alone, A and B at the same time, and B alone. A character "/" generally indicates that there is an "or" relationship between the associated objects before and after "/".

It need be noted that, in the present disclosure, a first direction X, a second direction Y, and a third direction Z intersect in pairs. In the present disclosure, as an example for illustration, the first direction X and the second direction Y are perpendicular to each other in a plane where a base substrate is located, the first direction X is a horizontal direction, the second direction Y is a vertical direction, and the third direction Z is a perpendicular direction perpendicular to the plane where the base substrate is located, but the present disclosure is not limited.

It should be noted that similar numerals and letters indicate similar items in the following drawings, and therefore, once an item is defined in one drawing, it does not need to be further defined and explained in subsequent drawings.

Through research, it is found that, because of self-luminous characteristics of OLED, using an Organic Electroluminescence Display (OLED) to achieve double-sided display of a display panel can solve a problem of a limited luminous brightness of an LCD panel. However, using OLED to achieve double-sided display is still necessary to prepare two OLED panels separately, and then make them fit each other. Because achieving synchronous display of two independent panels requires relatively complicated connection and drive, it is caused that a manufacturing cost of the display panel is greatly increased, and a thickness of the display panel is also made to be increased, which does not conform to a design of thinness and lightness the display panel.

In order to achieve double-sided display of an OLED panel, make its display structure light and thin, and reduce a preparation cost, a display panel is provided according to an embodiment of the present disclosure, which includes multiple pixel unit groups disposed on an base substrate and arranged in an array. Each pixel unit group includes a first pixel unit and a second pixel unit disposed on the base substrate. The first pixel unit includes a pixel driving circuit and a first light-emitting device electrically connected with the pixel driving circuit, and the second pixel unit includes a second light-emitting device. Compared with the prior art, the first light-emitting device and the second light-emitting device in an embodiment of the present disclosure are located in the same pixel unit group without preparing two independent display panels for fitting, thus lightness and thinness of the display panel can be achieved while a preparation cost is reduced. In addition, in an embodiment of the present disclosure, for pixel unit groups located in a same row, each pixel driving circuits and a second electrode of each second light-emitting device are connected with a same gate line; for pixel unit groups located in a same column, each pixel driving circuit is connected with a same data line, and a first electrode of each second light-emitting device is connected with a same data line. Through connections of all gate lines and all data lines, pixel driving circuits are used to drive first light-emitting devices and second light-emitting devices in the display panel, so that synchronous light emitting of the first light-emitting devices and the second light-emitting devices can be achieved, thereby achieving double-sided display of the display panel.

A display module according to an embodiment of the present disclosure will be described below with reference to the drawings in embodiments of the present disclosure.

Figure 2:
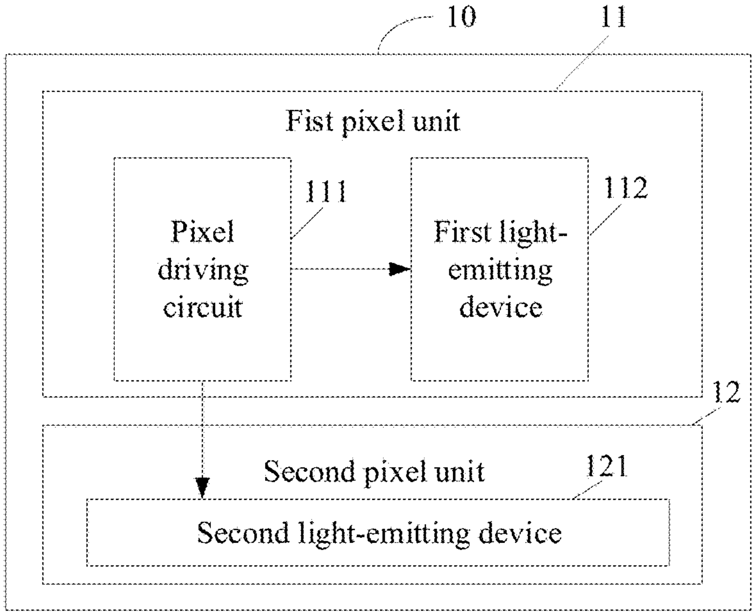
FIG. 2 is a schematic diagram of a pixel unit group according to an embodiment of the present disclosure.

FIG. 1 is a schematic diagram of a connection structure between pixel units according to an embodiment of the present disclosure, and FIG. 2 is a schematic diagram of a pixel unit group according to an embodiment of the present disclosure.

As shown in FIGS. 1 and 2, a display panel 100 includes multiple pixel unit groups 10 disposed on a base substrate 01 and arranged in an array. Each pixel unit group 10 includes a first pixel unit 11 and a second pixel unit 12 disposed on the base substrate 01. The first pixel unit 11 includes a pixel driving circuit 111 and a first light-emitting device OLED1 electrically connected with the pixel driving circuit 111, and the second pixel unit 12 includes a second light-emitting device OLED2. The pixel driving circuit 111 is used for driving the first light-emitting device OLED1 to emit light. The first light-emitting device OLED1 may achieve front light emitting of the display panel 100, and the second light-emitting device OLED2 may achieve back light emitting of the display panel 100.

As shown in FIG. 1, for pixel unit groups 10 located in a same row, each pixel driving circuit 111 and a second electrode 22 of each second light-emitting device 121 are connected to a same gate line G. While driving the first light-emitting device OLED1 to emit light, the pixel driving circuit 111 may deliver a signal to the second electrode 22 of each second light-emitting device OLED2 connected therewith through the connected gate line G.

As shown in FIG. 1, for pixel unit groups 10 located in a same column, each pixel driving circuit 111 is connected to a same data line S, and a first electrode 21 of each second light-emitting device OLED2 is connected to a same data line S.

It should be noted that, for the pixel unit groups 10 located in the same column, each pixel driving circuit 111 is connected to the same data line S, wherein the data line S may be connected with the first electrode 21 of each second light-emitting device OLED2 in the pixel unit groups 10 located in the same column; or, the data line S may be connected with the first electrode 21 of each second light-emitting device OLED2 in pixel unit groups 10 located in different columns, which may be set according to an actual situation.

It should be noted that, for the pixel unit groups 10 located in the different columns, each of pixel driving circuits 111 of multiple columns may be connected to a same data line S, or pixel driving circuits 111 of each column may be connected to different data lines S.

Exemplarily, the base substrate 01 of the present disclosure may be a flexible base substrate, wherein the flexible base substrate is prepared by a transparent material and capable of transmitting light generated by a light-emitting device to an external environment.

In some examples, pixel driving circuits 111 of different columns are connected to different data lines S. A connection mode between data lines S corresponding to the first pixel unit 11 and the second pixel unit 12 may be set according to a quantity of columns of pixel unit groups 10 in multiple pixel unit groups 10 arranged in an array.

If the first light-emitting device OLED1 and the second light-emitting device OLED2 in a same pixel unit group 10 display a same picture, there is a case that the picture is turned over, for example, a number viewed from the front is "IV" and the number viewed from the back is "VI". In order to eliminate an influence of turning-over of the double-sided display picture, an embodiment of the present disclosure provides a connection mode of data lines. Specifically, as shown in FIG. 1, multiple pixel unit groups 10 arranged in an array include pixel unit groups 10 of M rows by N columns; among them, M is a positive integer greater than or equal to 1, and N is a positive integer greater than or equal to 2. Pixel unit groups 10 of N columns are arranged along a first direction X in sequence, N data lines S are arranged along the first direction X in sequence, and an i-th column of pixel driving circuits 111 are connected with an i-th data line S, that is, each column of pixel driving circuits 111 has a connected data line S in one-to-one correspondence. 0<i≤N, and i is a positive integer. First electrodes 21 of a j-th column of second light-emitting devices OLED2 are connected to an (N−j+1)-th data line S; 1≤j≤N, and j is a positive integer.

As shown in FIG. 1, taking 4×4 pixel unit groups as an example, a first column of pixel driving circuits 111 are connected with a first data line S1, and the first data line S1 is connected with first electrodes 21 of a fourth column of second light-emitting devices OLED2, that is, all pixel driving circuits 111 of the first column and first electrodes 21 of all second light-emitting devices OLED2 of the fourth column are electrically connected through one data line (i.e., the first data line S1). Similarly, all pixel driving circuits 111 of a second column and first electrodes 21 of all second light-emitting devices OLED2 of a third column are electrically connected through a second data line S2. All pixel driving circuits 111 of the third column and first electrodes 21 of all second light-emitting devices OLED2 of the second column are electrically connected through a third data line S3. All pixel driving circuits 111 of the fourth column and first electrodes 21 of all second light-emitting devices OLED2 of the first column are electrically connected through a fourth data line S4.

As shown in FIG. 1, pixel unit groups 10 of M rows are arranged along a second direction Y in sequence, M gate lines G are arranged along the second direction Y in sequence, and a k-th row of pixel driving circuits 111 are connected with a k-th gate line G, that is, each row of pixel driving circuits 111 has a connected gate line G in one-to-one correspondence. 0<k≤M, and k is a positive integer. For pixel unit groups 10 located in a same row, each pixel driving circuit 111 and a second electrode 22 of each second light-emitting device OLED2 are connected to a same gate line G.

In some examples, as shown in FIG. 1, the display panel 100 of the present disclosure includes a display area DA (Display Area) and a peripheral area PA (Peripheral Area) disposed around the display area, wherein pixel driving circuits are disposed in the display area DA, a gate integrated driving circuit (Gate On Array, GOA) and a source driving Chip (IC) are disposed in the peripheral area PA, the GOA may provide a gate driving signal for each row of first pixel units through a gate line, and the source driving chip (IC) may provide a data signal for each column of first pixel units and each column of second pixel units through a data line.

Figure 3:
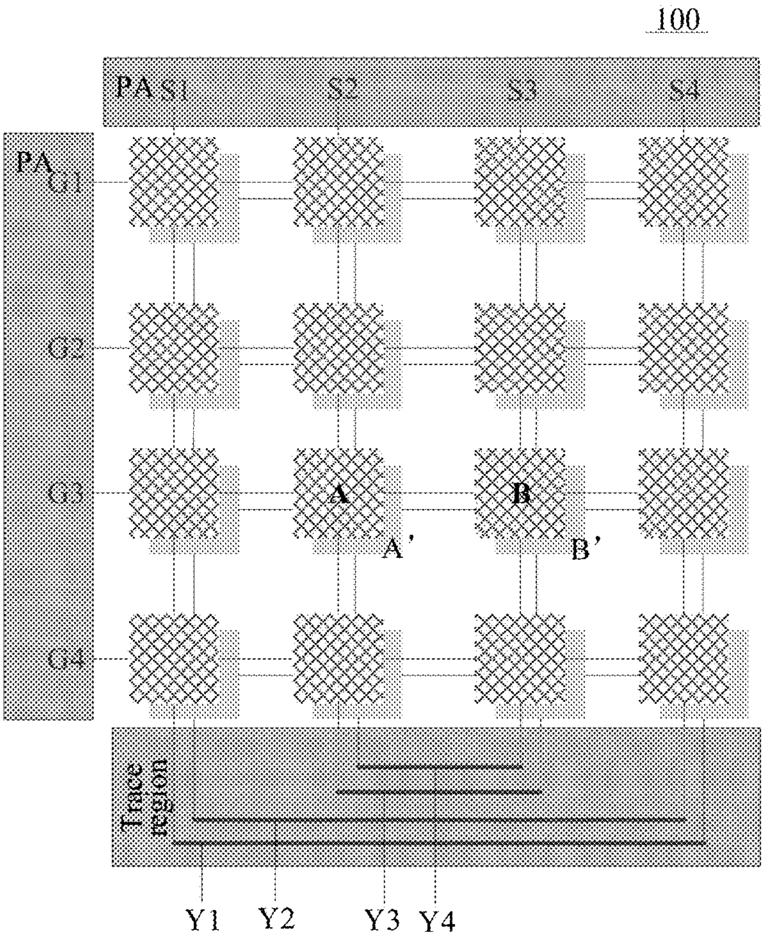
FIG. 3 is a schematic diagram of a connection structure of a first pixel unit and a second pixel unit according to an embodiment of the present disclosure.

FIG. 3 is a schematic diagram of a connection structure of a first pixel unit and a second pixel unit according to an embodiment of the present disclosure. As shown in FIG. 3, the display panel 100 further includes a connecting signal line Y; one data line S connected to a pixel driving circuit 111 is connected with one connecting signal line Y, and the connecting signal line Y is connected with a first electrode 21 of a second light-emitting device OLED2 through a trace region; and orthographic projections of all connecting signal lines Y on the base substrate 01 have no overlapping. Specifically, the first electrodes 21 of the j-th column of the second light-emitting devices OLED2 are connected to an (N−j+1)-th data line S.

For an embodiment of the present disclosure, overlapping of wiring connected between data lines S can be avoided by disposing the connecting signal line Y in the trace region, thereby reducing an interference of data signal transmissions between the data lines S, improving stability of driving circuits, and further improving a luminous brightness consistency.

Here, the connecting signal line Y and the data lines S may be in an integral structure, that is, the connecting signal line Y is a data line located in the trace region. As shown in FIG. 3, taking 4×4 pixel unit groups as an example, a first data line S1 is connected to all pixel driving circuits 111 of a first column, and then connected to the first electrodes 21 of all second light-emitting devices OLED2 of a fourth column through a trace region (that is, through a first connecting signal line Y1). Connection structures of other data lines S2, S3, and S4 are the same as that of S1, which will not be listed one by one in embodiments of the present disclosure.

Figure 4:
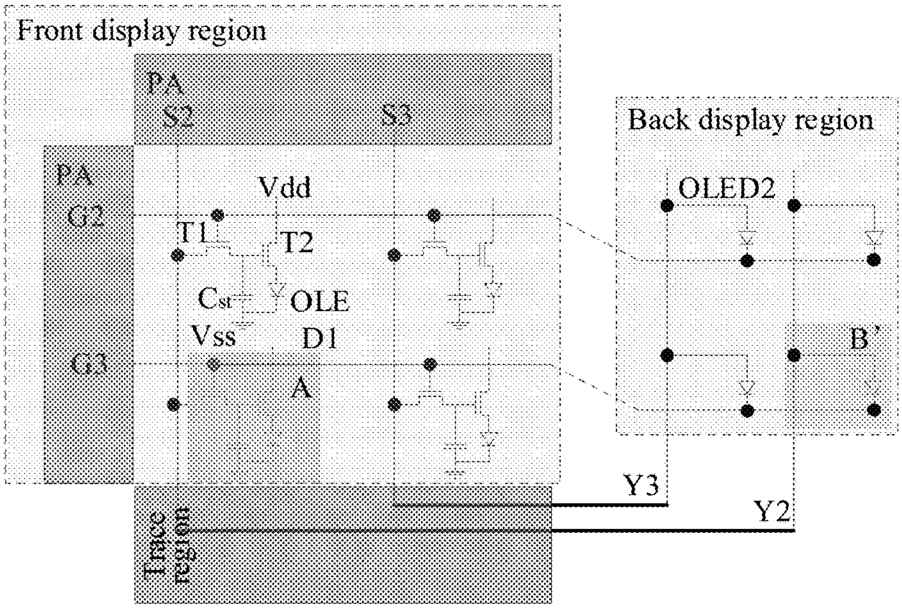
FIG. 4 is a circuit diagram of a display panel with double-sided display according to an embodiment of the present disclosure.

FIG. 4 is a circuit diagram of a display panel with double-sided display according to an embodiment of the present disclosure. As shown in FIG. 4, only a circuit diagram of four pixel unit groups 10 corresponding to a second row and a second column, a second row and a third column, a third row and a second column, and a third row and a third column in FIG. 3 are shown. Taking the pixel driving circuit 111 in a 2T1C structure (i.e., two thin film transistors and one capacitor) as an example, the gate line G2 for the third row is, respectively, electrically connected with gates 41 of switching thin film transistors T1 in all first pixel units 11 of the third row, and electrically connected with second electrodes 22 (i.e., cathodes) of second light-emitting devices OLED2 in all second pixel units 12 of the third row. The second data line S2 is, respectively, electrically connected with sources 42 of switching thin film transistors T1 in the second column of first pixel units 11, and electrically connected with first electrodes 12 (i.e., anodes) of the third column of second light-emitting devices OLED2 through the trace region. Exemplarily, as shown in FIG. 4, a gate line G2 is connected to a gate 41 of a switching thin film transistor T1 in a first pixel unit A and a cathode 22 of a second light-emitting device OLED2 in a second pixel unit B'. The data line S2 is connected to a source 42 of the switching thin film transistor T1 in the first pixel unit A and an anode 21 of the second light-emitting device OLED2 in the second pixel unit B'.

In a pixel driving circuit in a 2T1C structure, the first pixel unit 11 includes a switching thin film transistor T1 for switching control and a driving thin film transistor T2 for pixel driving. A drain 43 of the switching thin film transistor T1 is electrically connected with a gate 51 of the driving thin film transistor T2, and a first electrode plate Cst1 of a storage capacitor Cst; a source 52 of the driving thin film transistor T2 is electrically connected with a first power supply signal line Vdd; a drain 53 of the driving thin film transistor T2 is electrically connected with a first electrode 31 (i.e. an anode) of the first light-emitting device OLED1; and a second electrode 32 (i.e., a cathode) of the first light-emitting device OLED1 and a second electrode plate Cst2 of the storage capacitor Cst are electrically connected with a second power supply signal line Vss, respectively.

Figure 5:
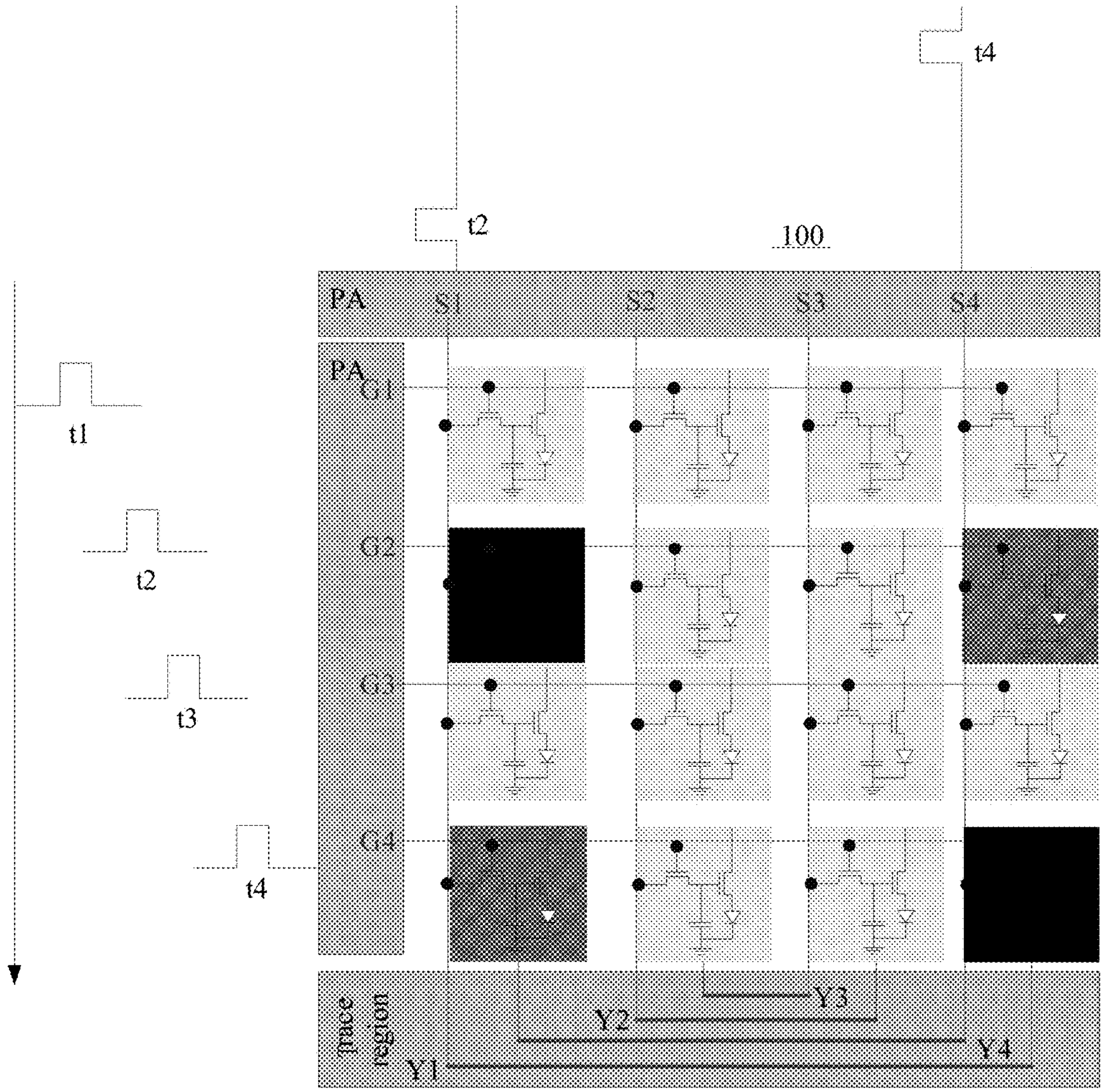
FIG. 5 is a timing control principle diagram of a display panel according to an embodiment of the present disclosure.

FIG. 5 is a timing control schematic diagram of a display panel according to an embodiment of the present disclosure. As shown in FIG. 5, taking 4×4 pixel unit groups as an example, by controlling gate lines to scan by lines, GOA provides a voltage signal pulse (i.e., a gate driving signal) for all pixel driving circuits 111 of a first row at a first time point t1; provides a voltage signal pulse (i.e. a gate driving signal) for all pixel driving circuits 111 of a second row at a second time point t2; provides a voltage signal pulse (i.e. a gate driving signal) for all pixel driving circuits 111 of a third row at a third time point t3; and provides a voltage signal pulse (i.e. a gate driving signal) for all pixel driving circuits 111 of a fourth row at a fourth time point t4. The above voltage signal pulse may be either a low-potential signal or a high-potential signal, which may be set according to an actual situation. An embodiment of the present disclosure is explained by taking an actual use of the low-potential signal as an example.

As shown in FIG. 5, IC provides a voltage pulse signal (i.e. a data signal) to a first column of pixel driving circuits 111 at a certain time point such as a time point t2 by controlling each data line S. At this time, at a time point t2, a gate line G2 for the second row and a first data line S1 simultaneously have a voltage pulse, correspondingly, a pixel driving circuit 111 at the cross-point of the second row and the first column has a gate driving signal and a data signal simultaneously, so that a first electrode 31 of a first light-emitting device OLED1 at the cross-point of the second row and the first column is at a high potential, thereby driving the first light-emitting device OLED1 to emit light. Meanwhile, at time point t2, the gate line G2 for the second row and the first data line S1 simultaneously have a voltage pulse, wherein, the gate line G2 for the second row correspondingly provides a voltage for a second electrode 22 of a second light-emitting device OLED2 at the cross-point of the second row and a fourth column, the first data line S1 correspondingly provides a voltage for a first electrode 21 of the second light-emitting device OLED2 at the cross-point of the second row and the fourth column, and the first electrode 21 and the second electrode 22 of the second light-emitting device OLED2 at the cross-point of the second row and the fourth column form a voltage difference, thereby driving the second light-emitting device OLED2 at the cross-point of the second row and the fourth column to emit light. Here, data signal timing of the first light-emitting device OLED1 at the cross-point of the second row and the first column keeps consistent with that of the second light-emitting device OLED2 at the cross-point of the second row and the fourth column, so that synchronous light emitting can be achieved and the display pictures are the same.

As shown in FIG. 5, the IC provides a voltage pulse signal (i.e. a data signal) for the fourth column of pixel driving circuits 111 at a certain time point, such as a time point t4, by controlling each data line. At this time, at a time point t4, a gate line G4 for the fourth row and a fourth data line S4 simultaneously have a voltage pulse, correspondingly, a pixel driving circuit 111 at the cross-point of the fourth row and the fourth column has a gate driving signal and a data signal simultaneously, so that a first electrode 31 of a first light-emitting device OLED1 at the cross-point of the fourth row and the fourth column is at a high potential, thereby driving the first light-emitting device OLED1 to emit light. Meanwhile, at a time point t4, the gate line G4 for the fourth row and the fourth data line S4 simultaneously have the voltage pulse, wherein, the gate line G4 for the fourth row correspondingly provides a voltage for a second electrode 22 of a second light-emitting device OLED2 at the cross-point of the fourth row and the first column, the fourth data line S4 correspondingly provides a voltage for a first electrode 21 of the second light-emitting device OLED2 at the cross-point of the fourth row and the first column, and the first electrode 21 and the second electrode 22 of the second light-emitting device OLED2 at the cross-point of the fourth row and the first column form a voltage difference, thereby driving the second light-emitting device OLED2 at the cross-point of the fourth row and the first column to emit light. Here, data signal timing of the first light-emitting device OLED1 at the cross-point of the fourth row and the fourth column keeps consistent with that of the second light-emitting device OLED2 at the cross-point of the fourth row and the first column, so that synchronous light emitting can be achieved and the display pictures are the same.

It should be noted that in the above timing control, only when voltages are simultaneously provided for a second light-emitting device OLED2 by a gate line and a data line to form a voltage difference, the second light-emitting device OLED2 emits light, thereby achieving double-sided display of the display panel 100.

Figure 6:
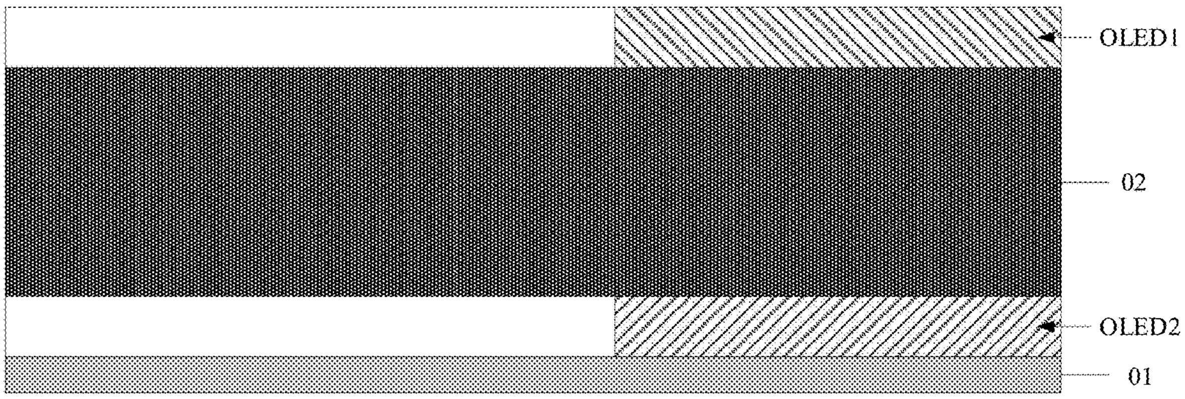
FIG. 6 is a schematic diagram of a structure of a display panel according to an embodiment of the present disclosure.

In some examples, FIG. 6 is a schematic diagram of a structure of a display panel according to an embodiment of the present disclosure. As shown in FIG. 6, the display panel 100 includes a driving circuit layer 02 disposed on the base substrate 01; pixel driving circuits 111 are located in the driving circuit layer 02. The first light-emitting device OLED1 is located at a side of the driving circuit layer 02 away from the base substrate 01; and the second light-emitting device OLED2 is located at a side of the driving circuit layer 02 close to the base substrate 01. Here, double-sided display of the display panel 100 is achieved by the first light-emitting device OLED1 and the second light-emitting device OLED2 disposed at opposite sides of the driving circuit layer 02.

As shown in FIG. 6, for a pixel unit group 10, an orthographic projection of the first light-emitting device OLED1 on the base substrate 01 and/or an orthographic projection of the second light-emitting device OLED2 on the base substrate 01 are both at least partially overlapped with an orthographic projection of the pixel driving circuit 111 on the base substrate 01. This mode in which a light-emitting device and a pixel driving circuit are disposed to be overlapped enables reasonable utilization of an occupied area of a thin film transistor in the pixel driving circuit, thereby increasing a quantity of pixel units disposed per unit area and thereby meeting a pixel requirement on the display panel 100 of high Pixels Per Inch (PPI).

Preferably, orthographic projections of any two of the first light-emitting device OLED1, the second light-emitting device OLED2, and the pixel driving circuit 111 on the base substrate 01 are overlapped.

In some examples, the pixel driving circuit 111 includes a thin film transistor and a storage capacitor Cst; the driving circuit layer 02 includes a first semiconductor layer, a first conductive layer, and a second conductive layer disposed in sequence at a side of the second light-emitting device OLED2 away from the base substrate; an active layer of the thin film transistor is located in the first semiconductor layer; a gate electrode of the thin film transistor, a first electrode plate of the storage capacitor, and a gate line are all located in the first conductive layer; a source and a drain of the thin film transistor are both located in the second conductive layer.

In an actual product, the pixel driving circuit may be in a 2T1C structure, a 5T2C structure, a 6T1C structure, a 6T2C structure, a 7T1C structure, a 7T2C structure, or a 9T2C structure, etc., which is not limited in embodiments of the present disclosure. An embodiment of the present disclosure will only be explained below by taking the pixel driving circuit in the 2T1C structure as an example. Specifically, the thin film transistor includes a switching thin film transistor T1 for switching control and a driving thin film transistor T2 for pixel driving.

Figure 7A:
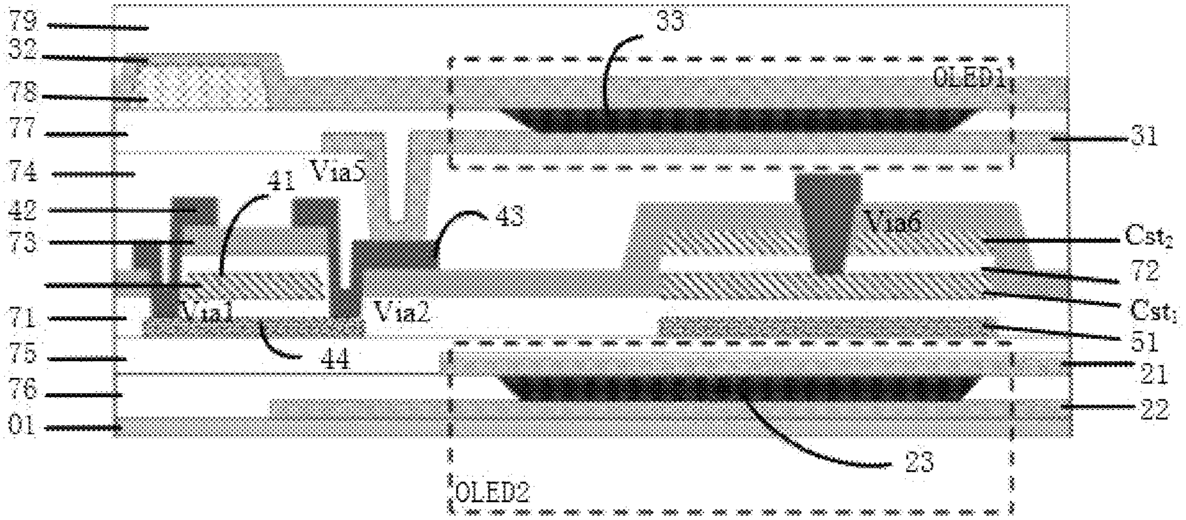
FIG. 7*a* is a schematic diagram of a film layer structure of a display panel according to an embodiment of the present disclosure.
Figure 7B:
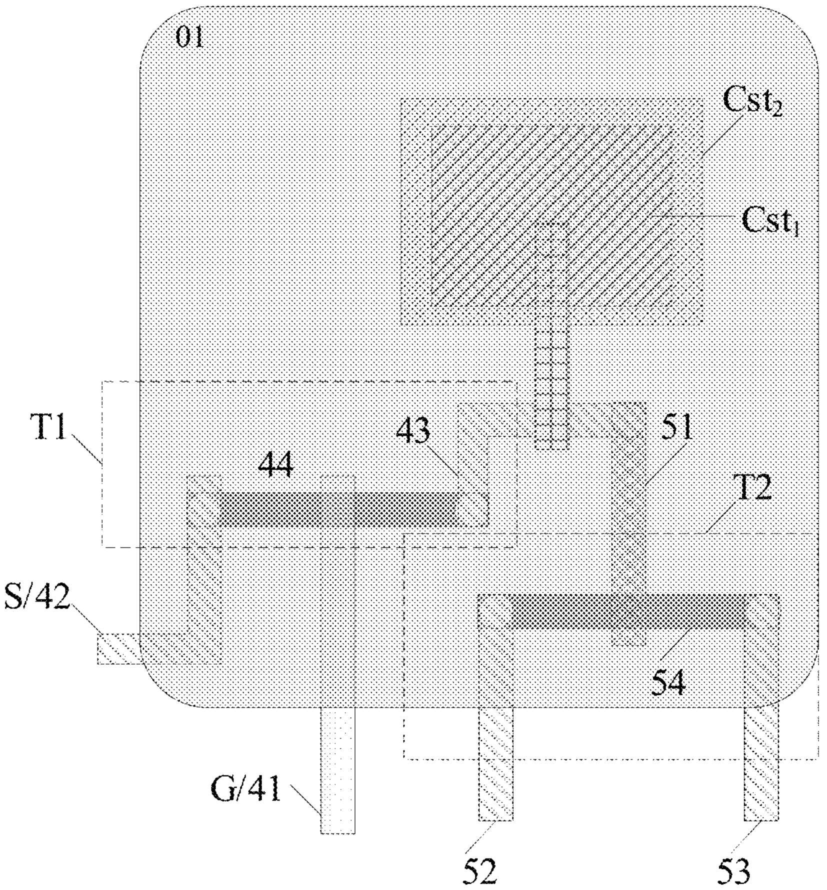
FIG. 7*b* is a film layer layout of a pixel driving circuit according to an embodiment of the present disclosure.

FIG. 7*a* is a schematic diagram of a film layer structure of a display panel according to an embodiment of the present disclosure, and FIG. 7*b* is a film layer layout of a pixel driving circuit according to an embodiment of the present disclosure. As shown in FIG. 4, FIG. 7*a*, and FIG. 7*b*, an active layer 44 of the switching thin film transistor T1 and an active layer 54 of the driving thin film transistor T2 are both located in a first semiconductor layer; a gate 41 of the switching thin film transistor T1 and a gate 51 of the driving thin film transistor T2 are both located in a first conductive layer; a source 42 and a drain 43 of the switching thin film transistor T1, and a source 52 and a drain 53 of the driving thin film transistor T2 are all located in a second conductive layer.

A first insulating layer 71 (i.e. a first gate insulating layer GI1) is disposed between the first semiconductor layer and the first conductive layer; a second insulating layer 72 (i.e. a second gate insulating layer GI2) is disposed between the first conductive layer and the second conductive layer and close to the first conductive layer; an opening layer 73 is disposed between the second insulating layer 72 and the second conductive layer; and a flat layer 74 is disposed between the second conductive layer and a first light-emitting device OLED1.

The source 42 of the switching thin film transistor T1 is electrically connected with a source region of the active layer 44 of the switching thin film transistor T1 through a first connecting via hole Via1 penetrating the opening layer 73, the first insulating layer 71, and the second insulating layer 72; the drain 43 of the switching thin film transistor T1 is electrically connected with a drain region of the active layer 44 of the switching thin film transistor T1 through a second connecting via hole Via2 penetrating the opening layer 73, the first insulating layer 71, and the second insulating layer 72; the source 52 of the driving thin film transistor T2 is electrically connected with a source region of the active layer 54 of the driving thin film transistor T2 through a third connecting via hole penetrating the opening layer 73, the first insulating layer 71, and the second insulating layer 72; the drain 53 of the driving thin film transistor T2 is electrically connected with a drain region of the active layer 54 of the driving thin film transistor T2 through a fourth connecting via hole penetrating the opening layer 73, the first insulating layer 71, and the second insulating layer 72. A first electrode 31 (i.e. an anode) of the first light-emitting device OLED1 is electrically connected with the drain 43 of the switching thin film transistor T1 through a fifth connecting via hole Via5 penetrating the flat layer 74. The drain 43 of the switching thin film transistor T1 or the gate 51 of the driving thin film transistor T2 is electrically connected with a first electrode plate Cst1 of a storage capacitor Cst through a sixth connecting via hole Via6 penetrating the opening layer 73 and the second insulating layer 72.

The switching thin film transistor T1 and the driving thin film transistor T2 of the present disclosure may be P-type transistors or N-type transistors, and embodiments of the present disclosure are explained by taking the P-type transistors as an example, that is, in the description of the present disclosure, both the switching thin film transistor T1 and the driving thin film transistor T2 are P-type transistors. However, it should be understood that thin film transistors of embodiments of the present disclosure are not limited to P-type transistors, and those skilled in the art may also use N-type transistors to achieve a function of one or more thin film transistors of the embodiments of the present disclosure according to an actual need.

In some examples, as shown in FIG. 7*a*, the display panel 100 further includes a buffer layer 75 disposed at a side of the first semiconductor layer close to the base substrate 01, and the first insulating layer 71 disposed between the first semiconductor layer and the first conductive layer. Among them, the buffer layer 75 may prevent or reduce diffusion of metal atoms and/or impurities from the base substrate 01 into the first semiconductor layer. In an embodiment of the present disclosure, the buffer layer 75 may include an inorganic material such as silicon oxide (SiOx) silicon nitride (SiNx), and/or silicon oxynitride (SiON), and may be formed as multiple layers or a single layer.

Figure 8:
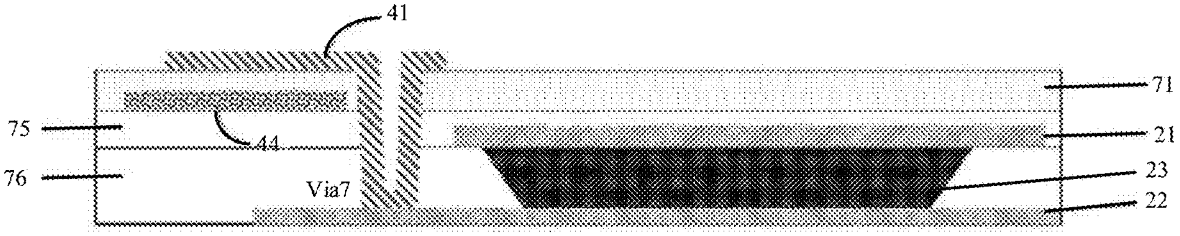
FIG. 8 is a schematic diagram of a connection structure of a second electrode of a second light-emitting device according to an embodiment of the present disclosure.

A second electrode 22 of a second light-emitting device OLED2 in a same pixel unit group is electrically connected with a gate line through a connecting via hole; and the connecting via hole (i.e. a seventh connecting via hole) penetrates the first insulating layer 71, the buffer layer 75, and a second pixel defining layer 76 in sequence. FIG. 8 is a schematic diagram of a connection structure of a second electrode of a second light-emitting device according to an embodiment of the present disclosure. As shown in FIG. 8, taking the pixel driving circuit 111 in the 2T1C structure as an example, the second electrode 22 of the second light-emitting device OLED2 and the gate 41 of the switching thin film transistor T1 in a same pixel unit group 10 are electrically connected by a gate line G and through the connecting via hole (i.e., the seventh connecting via hole Via7). Gates 41 of all switching thin film transistors T1 in different pixel unit groups 10 of a same row are electrically connected through the gate line G.

In some examples, as shown in FIG. 7*a*, the display panel 100 further includes a third conductive layer, a first pixel defining layer 77, and a fourth conductive layer disposed in sequence at a side of the driving circuit layer 02 away from the base substrate 01; and the first light-emitting device OLED1 includes a first electrode 31, a second electrode 32, and a first evaporated layer 33 sandwiched between the first electrode 31 and the second electrode 32. The first electrode 31 of the first light-emitting device OLED1 is located in the third conductive layer; the second electrode 32 of the first light-emitting device OLED1 is located in the fourth conductive layer; the first electrode 31 of the first light-emitting device OLED1 is a reflecting electrode, and the second electrode 32 of the first light-emitting device OLED1 is a transmitting electrode. The first evaporated layer 33 is located in the first pixel defining layer 77, and an orthographic projection of the second electrode 32 of the first light-emitting device OLED1 on the base substrate 01 covers an orthographic projection of the first evaporated layer 33 on the base substrate 01, so that light emitted from the first evaporated layer 33 is transmitted all through the transmitting electrode 32.

In embodiments of the present disclosure, explanations are all made by taking the first electrode being an anode and the second electrode being a cathode as an example. The transmitting electrode, i.e., a transparent cathode, can transmit light emitted from the evaporated layer; and the reflecting electrode, i.e., a reflecting anode, can reflect light emitted from the evaporated layer and reflect it out through the transparent cathode.

As shown in FIGS. 4, 7*a*, and 7*b*, the source 52 of the driving thin film transistor T2 is connected to the first power supply signal line Vdd, and a voltage is applied. The active layer 44 of the switching thin film transistor T1 has a source region, a drain region, and a channel region sandwiched between the source region and the drain region. When the gate 41 of the switching thin film transistor T1 is at a low potential $V_{negative}$, a channel region of the active layer 44 of the switching thin film transistor T1 is turned on, that is, a carrier sub-channel is formed; if a high potential $V_{positive}$ is applied to the source 42 of the switching thin film transistor T1, a data signal transmitted by a data line S is transmitted to the drain region of the switching thin film transistor T1 through the channel region, and then to the anode 31 of the first light-emitting device OLED1 through the drain 43 of the switching thin film transistor T1.

At this time, the anode 31 of the first light-emitting device OLED1 is at a high potential positive, and the cathode 32 of the first light-emitting device OLED1 has a potential of 0, which acts on the first evaporated layer 33, and the first evaporated layer 33 emits light and emitting light on a front side is achieved through the transparent cathode 32. Meanwhile, a voltage of the source 42 of the switching thin film transistor T1 is stored to the storage capacitor Cst, and a potential of the anode 31 of the first light-emitting device OLED1 is maintained so that the first evaporated layer 33 can continuously emit light.

In some examples, as shown in FIG. 7*a*, the display panel 100 further includes a fifth conductive layer, a second pixel defining layer 76, and a sixth conductive layer disposed in sequence at a side of the driving circuit layer 02 close to the base substrate 01; and the second light-emitting device OLED2 includes a first electrode 21, a second electrode 22, and a second evaporated layer 23 sandwiched between the first electrode and the second electrode. The first electrode 21 of the second light-emitting device OLED2 is located in the fifth conductive layer; the second electrode 22 of the second light-emitting device OLED2 is located in the sixth conductive layer; the first electrode 21 of the second light-emitting device OLED2 is a reflecting electrode, and the second electrode 22 of the second light-emitting device OLED2 is a transmitting electrode; the second evaporated layer 23 is located in the second pixel defining layer 76, and an orthographic projection of the second electrode 22 of the second light-emitting device OLED2 on the base substrate 01 covers an orthographic projection of the second evaporated layer 23 on the base substrate 01, so that light emitted by the second evaporated layer 23 is all transmitted via the transmitting electrode 22.

For an evaporated layer, in a preparation process, a luminous material may be evaporated into an opening of a pixel defining layer to form an evaporated layer, wherein the evaporated layer contains three kinds of pixels RGB (wherein R represents red, G represents green, and B represents blue).

There is a certain luminous threshold voltage $V_{luminous\ voltage}$ for the luminous material. The luminous threshold voltage $V_{luminous\ voltage}$ is designed to cause $V_{positive}+|V_{negative}|>V_{luminous\ voltage}>V_{positive}$ or $|V_{negative}|$, when a voltage loaded on electrodes on both sides of a light-emitting device is greater than the $V_{luminous\ voltage}$, the luminous material emits light.

As shown in FIGS. 4, 7*a*, and 7*b*, the source 52 of the driving thin film transistor T2 is connected to the first power supply signal line Vdd, and a voltage is applied. The active layer 44 of the switching thin film transistor T1 has a source region, a drain region, and a channel region sandwiched between the source region and the drain region. When the gate 41 of the switching thin film transistor T1 is at a low potential $V_{negative}$, the channel region of the active layer 44 of the switching thin film transistor T1 is turned on, that is, a carrier sub-channel is formed; if a high potential $V_{positive}$ is applied to the source 42 of the switching thin film transistor T1, a data signal transmitted by a data line S is transmitted to the drain region of the switching thin film transistor T1 through the channel region, and then to the anode 31 of the first light-emitting device OLED1 through the drain 43 of the switching thin film transistor T1. At this time, the anode 31 of the first light-emitting device OLED1 is at a high potential $V_{positive}$, and the cathode 32 of the first light-emitting device OLED1 has a potential of 0, which acts on the first evaporated layer, the first evaporated layer 33 emits light and emitting light on the front side is achieved through the transparent cathode 32. Meanwhile, since the gate 41 of the switching thin film transistor T1 is connected to the cathode 22 of the second light-emitting device OLED2, the cathode 22 of the second light-emitting device OLED2 is at a low potential $V_{negative}$; a data line S connected with the source 42 of the switching thin film transistor T1 is electrically connected with the anode 21 of the second light-emitting device OLED2, the anode 21 of the second light-emitting device OLED2 is at a high potential $V_{positive}$, and the anode 21 and the cathode 22 of the second light-emitting device OLED2 generate a voltage difference $V_{positive}-V_{negative}=V_{positive}+|V_{negative}|>V_{luminous\ voltage}$, and it acts on the second evaporated layer 23, the second evaporated layer 23 emits light, and emitting light on a reverse side is achieved through the transparent cathode 22.

When the gate 41 of the switching thin film transistor T1 is turned on, that is, it is at a low potential $V_{negative}$, and the source 42 of the switching thin film transistor T1 is not turned on, i.e. a voltage is 0, the first light-emitting device OLED1 does not emit light. Meanwhile, a voltage of electrodes at two sides of the second light-emitting device OLED2 is $0-V_{negative}<V_{luminous\ voltage}$, so the second light-emitting device OLED2 does not emit light.

When the gate 41 of the switching thin film transistor T1 is not turned on, i.e. a voltage is 0, and the source 42 of the switching thin film transistor T1 is turned on, i.e. a voltage is $V_{positive}$, the first light-emitting device OLED1 does not emit light. Meanwhile, the voltage of the electrodes at two sides of the second light-emitting device OLED2 is $V_{positive}-0<V_{luminous\ voltage}$, so the second light-emitting device OLED2 does not emit light.

It need be noted that, the second light-emitting device OLED2 here may be located in a same pixel unit group 10 as the pixel driving circuit 111, or may be located in another pixel unit group 10 of a same row as and a different column from the pixel driving circuit 111, which may refer to the above circuit connection relationship of FIG. 3 for details.

Figure 9:
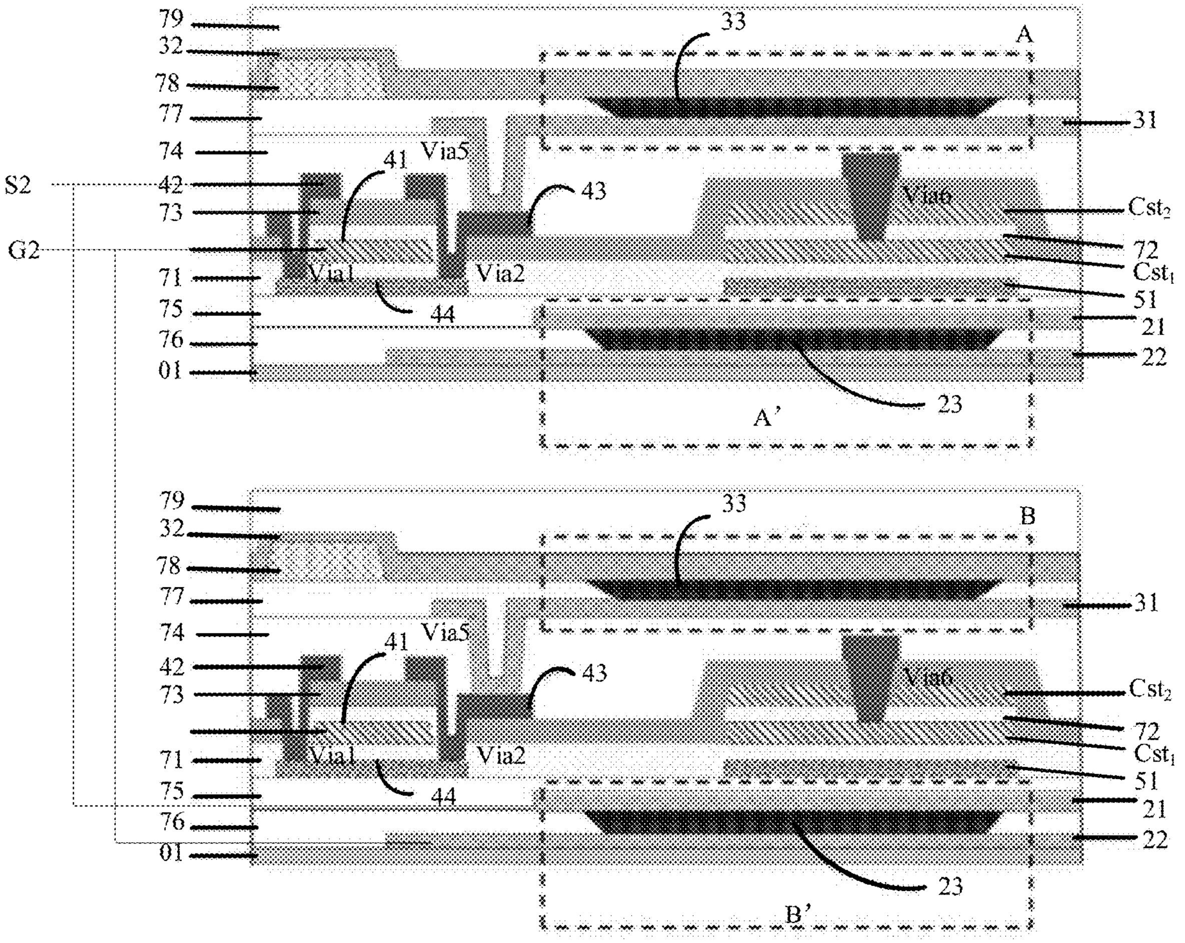
FIG. 9 is a schematic diagram of a film layer connection structure of a first pixel unit and a second pixel unit according to an embodiment of the present disclosure.

FIG. 9 is a schematic diagram of a film layer connection structure of a first pixel unit and a second pixel unit according to an embodiment of the present disclosure, wherein FIG. 9 shows part of film layers of a first pixel unit A at the cross-point of a second row and a second column and a second pixel unit B at the cross-point of a second row and a third column shown in FIG. 3. As shown in FIG. 9, a gate 41 of a switching transistor T1 of the first pixel unit A is electrically connected with a reflecting anode 21 of a second light-emitting device OLED2 of the second pixel unit B through a second gate line G2; and a source 42 of the switching thin film transistor T1 of the first pixel unit A is electrically connected with a transparent cathode 22 of the second light-emitting device OLED2 of the second pixel unit B through a second data line S2.

In some examples, as shown in FIG. 7*a*, a spacer layer 78 is disposed between the first pixel defining layer and the second electrode of the first light-emitting device. The spacer layer 78 may increase a path for external water vapor or oxygen to enter the display area DA, thereby protecting light-emitting devices in the display area DA.

In some examples, as shown in FIG. 7*a*, an encapsulation layer 79 is disposed at a side of the first light-emitting device away from the base substrate. The encapsulation layer 79 may be in a single-layer structure or a multi-layer structure. When the encapsulation layer 79 is in the multi-layer structure, the encapsulation layer 79 may include a first inorganic encapsulation layer, an organic encapsulation layer, and a second inorganic encapsulation layer, such as silicon nitride SiN+ink+silicon nitride SiN, which are disposed in sequence.

Further, the encapsulation layer 79 extends to a peripheral region to cover each film layer of a pixel unit.

In a second aspect, based on the same inventive concept, an embodiment of the present disclosure also provides a display apparatus, including the display panel described in any one in the above first aspect.

The principle for solving the problem with the display panel included in the display apparatus is similar to that of the display panel in the above embodiments, and a specific structure may refer to the above display panel, and the repetition will not be described here.

In a third aspect, based on the same inventive concept, an embodiment of the present disclosure also provides a method for preparing a display panel. Structures of various film layers of the display panel may be shown in FIG. 7*a*, and a specific process for preparing each film layers is as follows.

In S1, a sixth conductive layer (that is, the transmitting cathode 22 of the second light-emitting device OLED2) is formed on the base substrate 01.

A process for forming the sixth conductive layer includes, but is not limited to, photoresist coating-exposure-development-etching-peeling, and the like.

In S2, a second pixel defining layer 76 is formed at a side of the sixth conductive layer away from the base substrate 01, and an opening is formed at a preset position on the second pixel defining layer 76.

In S3, a light emitting material is evaporated at the opening of the second pixel defining layer 76 to form a second evaporated layer 23.

In S4, a fifth conductive layer (that is, the reflective anode 21 of the second light-emitting device OLED2) is formed at a side of the second evaporated layer 23 away from the base substrate 01.

In S5, a buffer layer 75 is formed at a side of the fifth conductive layer away from the base substrate 01.

In S6, a semiconductor layer is formed at a side of the buffer layer 75 away from the base substrate 01, and an active layer (i.e., the first semiconductor layer) of the thin film transistor is prepared by performing a photoresist coating-exposure-development-etching-peeling process, and the like on the semiconductor layer.

In S7, a first insulating layer 71 (which may be a gate insulating layer GI1) is formed at a side of the first semiconductor layer away from the base substrate 01.

In S8, a first conductive layer (including a gate of a thin film transistor, each gate line, and a first electrode plate of a storage capacitor) is formed at a side of the first insulating layer 71 away from the base substrate 01.

In S9, a second insulating layer 72 (which may be a gate insulating layer GI2) is formed at a side of the first conductive layer away from the base substrate 01.

In S10, for the first electrode plate Cst1 of the storage capacitor Cst, a second electrode plate Cst2 of the storage capacitor Cst is formed at a side of the first electrode plate Cst1 facing the second insulating layer 72 and away from the base substrate 01.

In S11, an opening layer 73 is formed at a side of the second insulating layer 72 away from the base substrate 01 and at a side of the second electrode plate Cst2 away from the base substrate 01.

In S12, a second conductive layer (including a source and a drain of the thin film transistor) is formed at a side of the opening layer 73 away from the base substrate 01.

In S13, a flat layer 74 is formed at a side of the second conductive layer away from the base substrate 01.

In S14, a third conductive layer (including the reflective anode 31 of the first light-emitting device OLED1) is formed at a side of the flat layer 74 away from the base substrate 01.

In S15, a first pixel defining layer 77 is formed at a side of the third conductive layer away from the base substrate 01, and an opening is formed at a preset position on the first pixel defining layer 77.

In S16, a light emitting material is evaporated at the opening of the first pixel defining layer 77 to form a first evaporated layer 33; and a spacer layer 78 is formed in an edge region of the first pixel defining layer 77.

In S17, a fourth conductive layer (that is, the transmitting cathode 32 of the first light-emitting device OLED1) is formed at a side of the first pixel defining layer 77 and the spacer layer 78 away from the base substrate 01.

In S18, an encapsulation layer 79 is formed at a side of the fourth conductive layer away from the base substrate 01.

Aiming at the above acts S1 to S18, a hole is punched at a film layer position which needs to be punched, to form a first connecting via hole Via1, a second connecting via hole Via2, a third connecting via hole, a fourth connecting via hole, a fifth connecting via hole Via5, a sixth connecting via hole Via6, and a seventh connecting via hole Via7.

It is to be understood that the above embodiments are only exemplary embodiments employed for the purpose of illustrating the principles of the present disclosure, however the present disclosure is not limited thereto. To those of ordinary skills in the art, various modifications and improvements may be made without departing from the essence and the substance of the present disclosure, and these modifications and improvements are also considered to be within the protection scope of the present disclosure.

The invention claimed is:

1. A display panel, comprising a base substrate and a plurality of pixel unit groups disposed on the base substrate and arranged in an array, each of the pixel unit groups comprising a first pixel unit and a second pixel unit disposed on the base substrate; wherein the first pixel unit comprises a pixel driving circuit and a first light-emitting device electrically connected with the pixel driving circuit, and the second pixel unit comprises a second light-emitting device; wherein, for the pixel unit groups located in a same row, each of pixel driving circuits and a second electrode of each of second light-emitting devices are connected to a same gate line;

for the pixel unit groups located in a same column, each of the pixel driving circuits is connected to a same data line, and a first electrode of each of the second light-emitting devices is connected to the same data line.

2. The display panel of claim 1, wherein the plurality of pixel unit groups arranged in an array comprise the pixel unit groups of M rows by N columns; where M is a positive integer greater than or equal to 1, and N is a positive integer greater than or equal to 2;

N columns of the pixel unit groups are arranged along a first direction in sequence, N data lines are arranged along the first direction in sequence, and an i-th column of the pixel driving circuits and an i-th data line are connected; 0≤iN, and i is a positive integer;

first electrodes of a j-th column of the second light-emitting devices are connected to an (N−j+1)-th data line; $1 \le j \le N$, where j is a positive integer.

3. The display panel of claim 1, wherein the display panel further comprises a connecting signal line;

one data line connected with the pixel driving circuits is connected with one connecting signal line, and the connecting signal line is connected with the first electrode of the second light-emitting device through a trace region;

orthographic projections of all of the connecting signal lines on the base substrate are not overlapped.

4. The display panel of claim 1, wherein the display panel comprises a driving circuit layer disposed on the base substrate; the pixel driving circuit is located in the driving circuit layer;

the first light-emitting device is located at a side of the driving circuit layer away from the base substrate; the second light-emitting device is located at a side of the driving circuit layer close to the base substrate;

for one of the pixel unit groups, an orthographic projection of the first light-emitting device on the base substrate and/or an orthographic projection of the second light-emitting device on the base substrate are both at least partially overlapped with an orthographic projection of the pixel driving circuit on the base substrate.

5. The display panel of claim 4, wherein orthographic projections of any two of the first light-emitting device, the second light-emitting device, and the pixel driving circuit on the base substrate are overlapped.

6. The display panel of claim 1, wherein the pixel driving circuit comprises a thin film transistor and a storage capacitor;

the driving circuit layer comprises a first semiconductor layer, a first conductive layer, and a second conductive layer disposed at a side of the second light-emitting device away from the base substrate in sequence;

an active layer of the thin film transistor is located in the first semiconductor layer;

a gate of the thin film transistor, a first electrode plate of the storage capacitor, and the gate line are all located in the first conductive layer;

a source and a drain of the thin film transistor are both located in the second conductive layer.

7. The display panel of claim 6, wherein the display panel further comprises a buffer layer disposed at a side of the first semiconductor layer close to the base substrate, and a first insulating layer disposed between the first semiconductor layer and the first conductive layer;

second electrodes of the second light-emitting devices in a same pixel unit group are electrically connected with the gate line through a connecting via hole; and the connecting via hole penetrates a second pixel defining layer, the buffer layer, and the first insulating layer in sequence.

8. The display panel of claim 4, wherein the display panel further comprises a third conductive layer, a first pixel defining layer, and a fourth conductive layer that are disposed at a side of the driving circuit layer away from the base substrate in sequence;

a first electrode of the first light-emitting device is located in the third conductive layer; a second electrode of the first light-emitting device is located in the fourth conductive layer; the first electrode of the first light-emitting device is a reflecting electrode, and the second electrode of the first light-emitting device is a transmitting electrode;

a first evaporated layer of the first light-emitting device is located in the first pixel defining layer, and an orthographic projection of the second electrode of the first light-emitting device on the base substrate covers an orthographic projection of the first evaporated layer on the base substrate.

9. The display panel of claim 4, wherein the display panel further comprises a fifth conductive layer, a second pixel defining layer, and a sixth conductive layer that are disposed at a side of the driving circuit layer close to the base substrate in sequence;

a first electrode of the second light-emitting device is located in the fifth conductive layer; a second electrode of the second light-emitting device is located in the sixth conductive layer; the first electrode of the second light-emitting device is a reflecting electrode, and the second electrode of the second light-emitting device is a transmitting electrode;

a second evaporated layer of the second light-emitting device is located in the second pixel defining layer, and an orthographic projection of the second electrode of the second light-emitting device on the base substrate covers an orthographic projection of the second evaporated layer on the base substrate.

10. A display apparatus, comprising the display panel of claim 1.

11. A display apparatus, comprising the display panel of claim 2.

12. A display apparatus, comprising the display panel of claim 3.

13. A display apparatus, comprising the display panel of claim 4.

14. A display apparatus, comprising the display panel of claim 5.

15. A display apparatus, comprising the display panel of claim 6.

16. A display apparatus, comprising the display panel of claim 7.

17. A display apparatus, comprising the display panel of claim 8.

18. A display apparatus, comprising the display panel of claim 9.

* * * * *